United States Patent
Hsu et al.

(10) Patent No.: US 7,372,763 B2
(45) Date of Patent: *May 13, 2008

(54) MEMORY WITH SPATIALLY ENCODED DATA STORAGE

(75) Inventors: Steven K. Hsu, Lake Oswego, OR (US); Atul Maheshwari, Portland, OR (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/321,366

(22) Filed: Dec. 28, 2005

(65) Prior Publication Data

US 2007/0147158 A1 Jun. 28, 2007

(51) Int. Cl.
 *G11C 7/00* (2006.01)
 *G11C 7/10* (2006.01)
(52) U.S. Cl. ............... 365/227; 365/194; 365/189.08
(58) Field of Classification Search ............ None
 See application file for complete search history.

(56) References Cited

U.S. PATENT DOCUMENTS

| | | | |
|---|---|---|---|
| 5,426,609 A * | 6/1995 | Okuda | 365/201 |
| 5,940,332 A * | 8/1999 | Artieri | 365/189.08 |
| 6,320,795 B1 | 11/2001 | Balamurugan et al. | |
| 6,363,001 B1 * | 3/2002 | Borot et al. | 365/104 |
| 6,563,745 B1 * | 5/2003 | Ilkbahar | 365/189.07 |
| 6,608,779 B1 * | 8/2003 | Burgess et al. | 365/189.01 |
| 6,628,557 B2 | 9/2003 | Hsu et al. | |
| 6,690,607 B2 * | 2/2004 | Burgess et al. | 365/207 |
| 6,781,892 B2 | 8/2004 | Hsu et al. | |
| 6,918,002 B2 * | 7/2005 | Kumaki et al. | 711/104 |
| 7,184,332 B2 * | 2/2007 | Turgis | 365/201 |
| 2005/0198472 A1 * | 9/2005 | Sih et al. | 712/218 |
| 2006/0221724 A1 * | 10/2006 | Maheshwari et al. | 365/189.07 |

OTHER PUBLICATIONS

Rabaey, et al. Digital Integrated Circuits: A Design Perspective, 2003, Prentice Hall, 2nd ed, pp. 87-105.*
Mark Anders, U.S. Appl. No. 11/094,811, filed on Mar. 31, 2005.

* cited by examiner

*Primary Examiner*—Huan Hoang
*Assistant Examiner*—Michael Weinberg
(74) *Attorney, Agent, or Firm*—Erik R. Nordstrom

(57) ABSTRACT

In some embodiments, the invention provides a chip with at least one memory circuit that comprises a majority voter circuit with first and second digitally controlled variable delay elements. The first delay element is controlled by data bits that are to be written to a portion of the memory circuit. The majority voter circuit determines if the data bits are to be inverted prior to being written into the memory circuit portion.

19 Claims, 3 Drawing Sheets

US 7,372,763 B2

MEMORY WITH SPATIALLY ENCODED DATA STORAGE

BACKGROUND

Active and leakage power dissipation are important issues in modern large scale integrated circuit chips such as microprocessors. Single ended memories like register file circuits, read only memory (ROM) circuits and dynamic random access memory (DRAM) circuits are a significant component of the total active and leakage power dissipation in such chips. With technology scaling, such power consumption from memory circuits is increasing and proving to be a serious limitation, for example, in mobile application chips. Accordingly, improved circuits for reducing power in memory is desired.

BRIEF SUMMARY OF THE INVENTION

In some embodiments, the invention provides a chip with at least one memory circuit that comprises a majority voter circuit with first and second digitally controlled variable delay elements. The first delay element is controlled by data bits that are to be written to a portion of the memory circuit. The majority voter circuit determines if the data bits are to be inverted prior to being written into the memory circuit portion.

BRIEF DESCRIPTION OF THE DRAWINGS

Embodiments of the invention are illustrated by way of example, and not by way of limitation, in the figures of the accompanying drawings in which like reference numerals refer to similar elements.

DETAILED DESCRIPTION

Disclosed herein are embodiments for reducing both active and leakage power. For example, up to 50% reduction in worst case power dissipation may be achieved. Spatially encoded data storage can result in at least half of the bit cells in a memory array being in a reduced power state.

Figure 1:
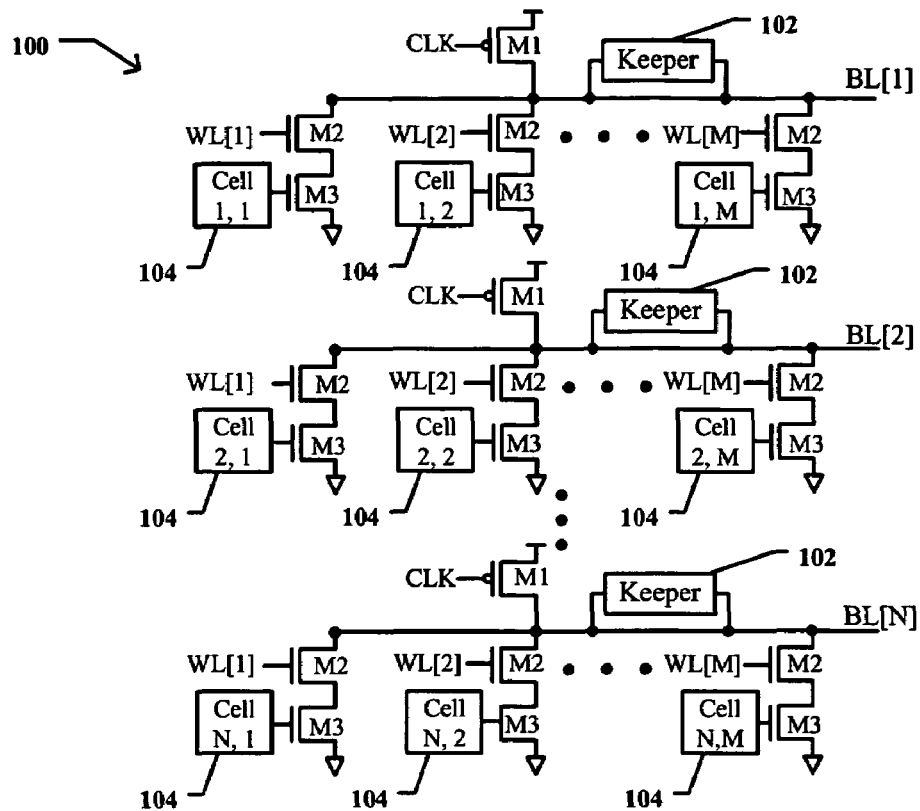
FIG. 1 is a schematic diagram of a portion of a conventional register file array.

FIG. 1 shows a conventional single-ended register file array circuit. It comprises M, N-bit words of data cells 104. (In the depicted figure, each column of cells corresponds to a separate N-bit word.) The array comprises N bit-lines (BL-1] to BL[N]) serving as single-ended, dynamic data nodes for the bits in a word. Each bit line is coupled to a precharge transistor M1, a keeper circuit (e.g., p-type transistor), and to M cell-access stacks formed from series coupled transistors M2 and M3. Transistor M2 is coupled to an associated word line signal (WL[i]), while transistor M3 is coupled to an associated memory cell 104.

In operation, When a word (or column) is to be read, a word line (WL[i]) for a particular column is asserted (High), which causes the cell values in that column to be coupled through to their associated bit line, where they are read or driven through an output driver (not shown). The depicted register file 100 is implemented using dynamic logic and thus has a keeper 102 coupled to each bit line to mitigate against the effects of leakage.

The amount of both active and leakage power consumed depends on the distribution of stored values in the cells 104. With the depicted configuration, if more '1s are stored, there is higher leakage (due to the M3 transistors being turned on thereby reducing the impedance in their stack). The active power consumption will also be higher due to more bit line nodes over time being discharged. Accordingly, embodiments disclosed herein address these problems and reduce active and/or leakage power consumption.

Figure 2:
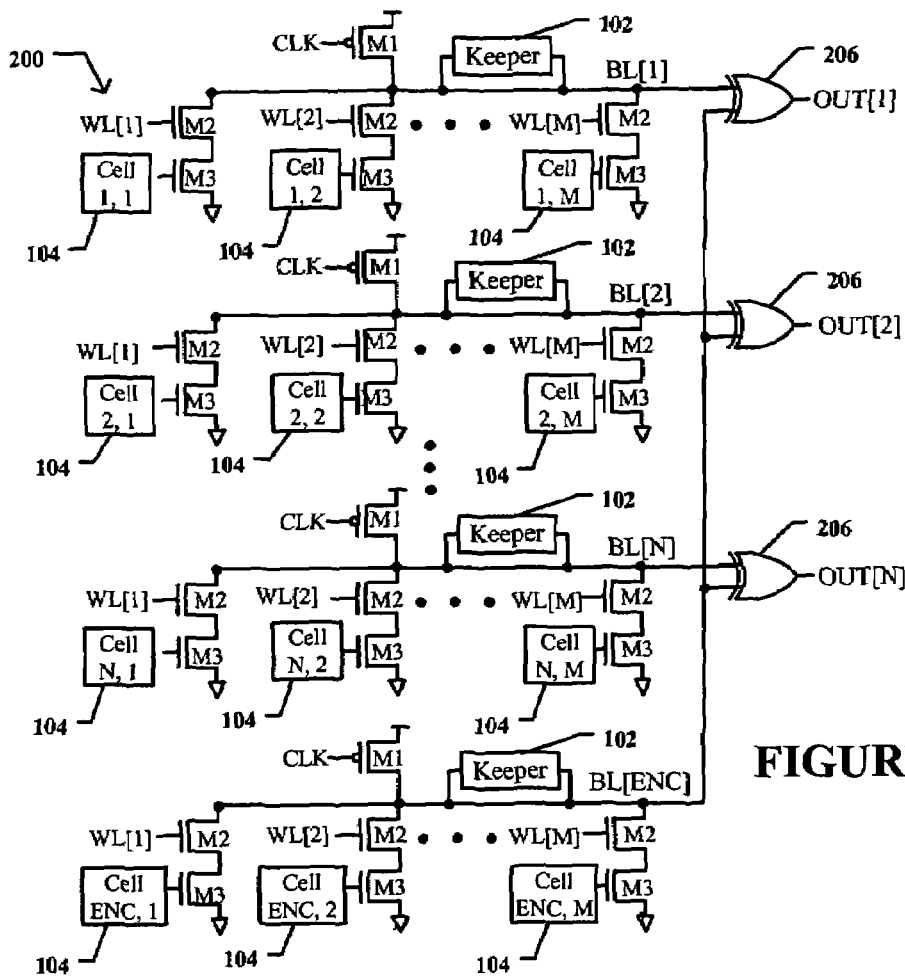
FIG. 2 is a block diagram of a portion of a register file circuit with spatially encoded data in accordance with some embodiments.

FIG. 2 shows a register file circuit 200 with spatially encoded data. It is the same as the register file of FIG. 1 except that (i) it includes an additional encoding bit line (BL[ENC]), (ii) its stored data is spatially encoded, and (iii) it includes an XOR gate 206 provided for each data bit line. As indicated, a first input from each XOR gate 206 is coupled to an associated data bit line and a second input is coupled to the encoding (ENC) bit line. The XOR outputs (OUT[1] to OUT[N]) provide the data output bits for a word read from the register file array 200.

As used herein, "spatial encoding" refers to encoding data that is stored in a memory array to reduce (or reasonably minimize) the number of higher power consuming states in the memory. With the depicted array 200, for example, a stored '1 results in higher power consumption than a stored '0. This is so because in this depicted embodiment, NMOS transistors are used in the cell access stacks. Thus, depending on the configuration (e.g., with PMOS stack transistors) of the memory circuit, a '0 could be the higher power consuming state. With the depicted embodiment, data values in a given word (column) are inverted if more than half are '1s and then inverted again when read if they were inverted when stored. However, other schemes could be used to reduce the number of higher power consuming states in the array.

(The term "NMOS transistor" refers to an N-type metal oxide semiconductor field effect transistor. Likewise, "PMOS transistor" refers to a P-type metal oxide semiconductor field effect transistor. It should be appreciated that whenever the terms: "transistor", "MOS transistor", "NMOS transistor", or "PMOS transistor" are used, unless otherwise expressly indicated or dictated by the nature of their use, they are being used in an exemplary manner. They encompass the different varieties of MOS devices including devices with different VTs and oxide thicknesses to mention just a few. Moreover, unless specifically referred to as MOS or the like, the term transistor can include other suitable transistor types, e.g., junction-field-effect transistors, bipolar-junction transistors, and various types of three dimensional transistors, known today or not yet developed.)

With the register file of FIG. 2, when data is written to a word (e.g., a word at a time), it is determined if more than half of the bits in the word are '1s, and the ENC bit is used to indicate this determination. If more than half of the bits are '1, then the data is inverted before it is written into the cells, and the encoding (ENC) bit, in the depicted embodiment, is made to be '1. If not, then the data is written, as is, into the cells, and the encoding bit is made '0. (Note that this spatially encoded data storage technique reduces active and leakage power for the register file as a whole but not necessarily for each row (bit line. It is still possible to have more than half '1's in a row but not in a column.) When a word is read, the ENC bit for the word (column) to be read is also read and is XORed (via XOR gates 206) with each data bit in the read word to obtain the correct data at the output lines (OUT[1] to OUT[N]). (Note that only one read port is indicated in this figure.) Thus, the delay overhead for a read operation may only be just an XOR gate delay. Alternatively the data could be left encoded, e.g., if it is transmitted over a bus to save bus power dissipation.

The technique used to determine if more than half the bits in a word to be stored (written) are "1" may be performed using any suitable approach. For example, it may be implemented using appropriate circuitry (analog and/or digital logic) ahead of the register file cells 104. In some embodiments, delay threshold logic such as the circuit of FIG. 3 may be used to achieve the encoding with tolerable delay and power consumption.

Figure 3:
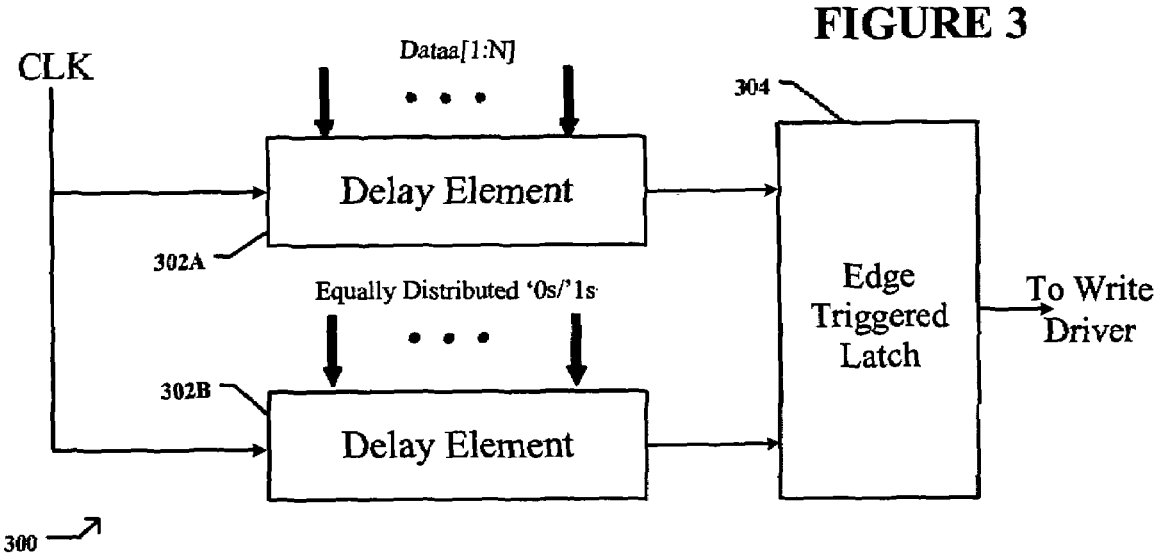
FIG. 3 is a block diagram of a majority voting circuit suitable for use in writing data according to a spatially encoded data storage technique.

FIG. 3 shows a majority voting circuit 300 in accordance with some embodiments, which may be used to spatially encode data for a memory as disclosed herein. The majority voting circuit 300 comprises first and second digitally-controlled variable delay elements 302A, 302B coupled to an edge-triggered latch 304. Both delay elements 302A, 302B have a common clock signal (CLK) applied at their inputs, and their outputs are coupled to inputs of the edge-triggered latch 304.

The first delay element has N equally weighted inputs to receive the N data bits of a word to be written into a register file. It delays the input clock (CLK) based on how many of these input bits are at '1. For example, the delay may be reduced by a fixed amount for each data input that is at '1. On the other hand, the second delay element 302B is configured to delay the CLK signal by a fixed amount equivalent to the first delay circuit delay if half of its bits are '1 and half are '0. For example, it may be implemented with the same type of delay element with half of its N data inputs at '1 and the other half at '0. For additional information regarding such a majority voter circuit, reference may be made to commonly owned U.S. patent application Ser. No. 11/094,811 entitled "DATA CONVERTER AND A DELAY THRESHOLD COMPARATOR" filed on Mar. 31, 2005.

The latch 304 compares the clock delay from the first delay element 302A to that from the second delay element 302B. Its output is determined by which delay element's clock pulse reaches the latch first. For example, it may be a '1 if the clock signal from the first delay element 302A arrives first, indicating that more of the data bits are '1s. On the other hand, it may be a '0 if the second delay element's clock arrives first, indicating that less than half of the data bits are '1s. The output could then be used as a control signal to cause data to be written into a register file word to be inverted or not to be inverted. For example, it could be used to control multiplexers, with inverting and non-inverting paths, in front of a register file write port to cause an inverted or non-inverted form of the data to be written into the register file.

Figure 4:
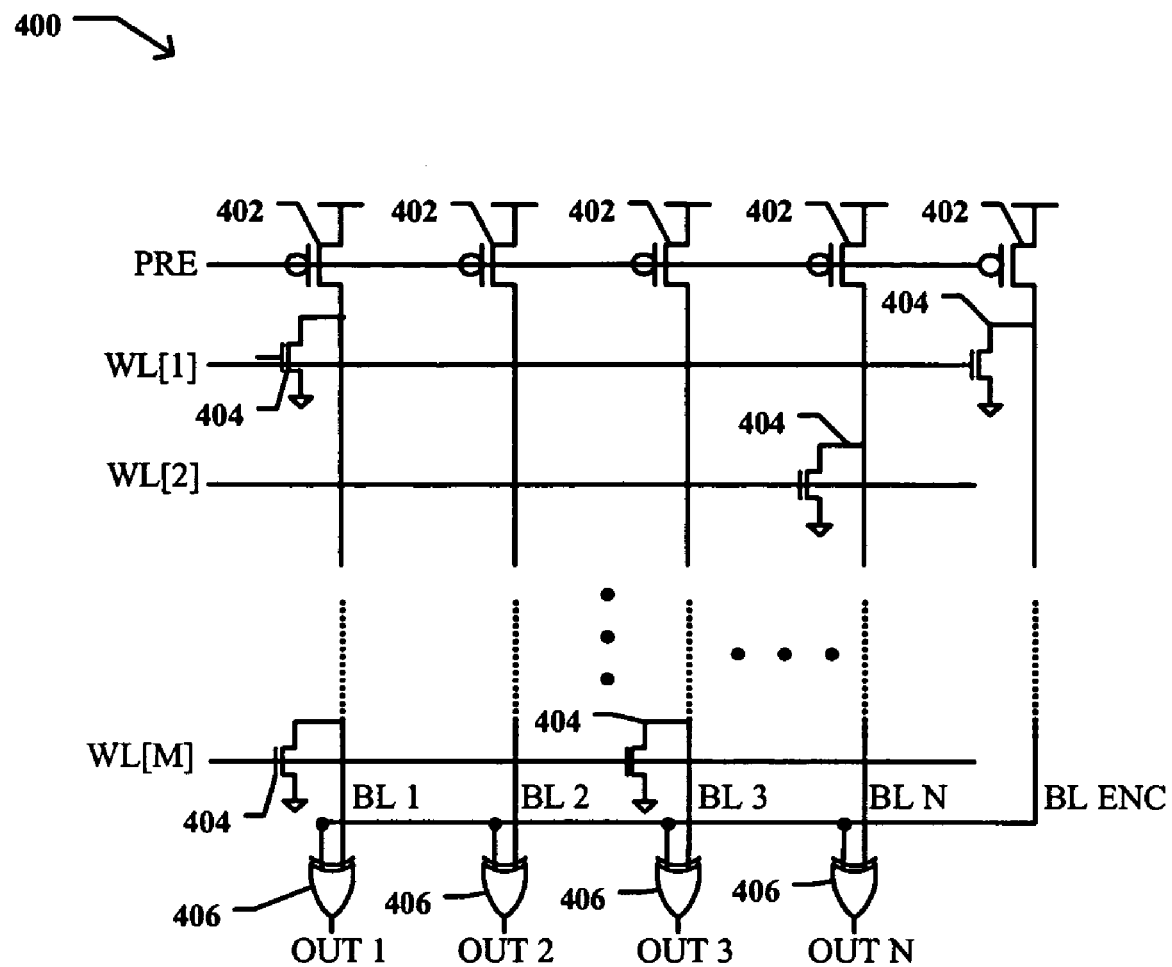
FIG. 4 is a schematic diagram of a read only memory circuit with spatially encoded data storage in accordance with some embodiments.

It should be appreciated that disclosed spatially encoded memory storage techniques can be applied to any suitable (e.g., single ended) memory. For example, it could be used in dynamic random access memory (DRAM) and read only memory (ROM). Accordingly, FIG. 4 shows a ROM array 400 with spatially encoded data. ROM 400 comprises pre-charge transistors 402 and Low data transistors 404 in memory locations where a Low ('0) value occurs. It also includes an additional column of data (BL ENC) for each row (or word) of data and XOR gates 406 coupled to the encoding bit line and to an associated data bit line to provide an output data bit line. The encoding bit line (BL ENC) stores the encoding bit for each column (or word) to indicate whether the data in a given word (or row) has been inverted or not.

Figure 5:
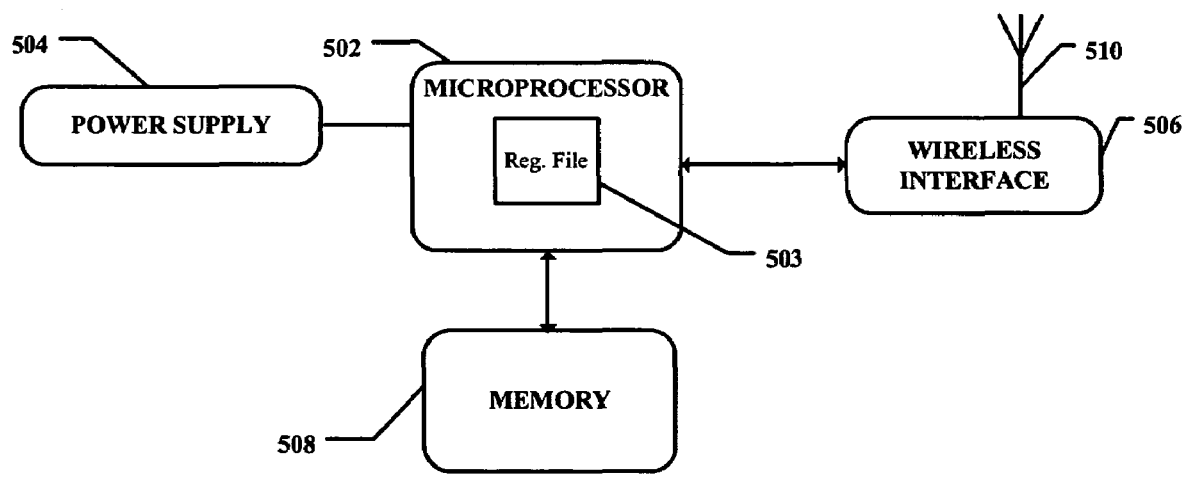
FIG. 5 is a block diagram of a computer system with at least one register file having spatially encoded data in accordance with some embodiments.

With reference to FIG. 5, one example of a computer system is shown. The depicted system generally comprises a processor 502 that is coupled to a power supply 504, a wireless interface 506, and memory 508. It is coupled to the power supply 504 to receive from it power when in operation. The wireless interface 506 is coupled to an antenna 510 to communicatively link the processor through the wireless interface chip 506 to a wireless network (not shown). Microprocessor 502 comprises a register file 503 with spatially encoded data storage in accordance with embodiments discussed herein.

It should be noted that the depicted system could be implemented in different forms. That is, it could be implemented in a single chip module, a circuit board, or a chassis having multiple circuit boards. Similarly, it could constitute one or more complete computers or alternatively, it could constitute a component useful within a computing system.

The invention is not limited to the embodiments described, but can be practiced with modification and alteration within the spirit and scope of the appended claims. For example, it should be appreciated that the present invention is applicable for use with all types of semiconductor integrated circuit ("IC") chips. Examples of these IC chips include but are not limited to processors, controllers, chip set components, programmable logic arrays (PLA), memory chips, network chips, and the like.

Moreover, it should be appreciated that example sizes/models/values/ranges may have been given, although the present invention is not limited to the same. As manufacturing techniques (e.g., photolithography) mature over time, it is expected that devices of smaller size could be manufactured. In addition, well known power/ground connections to IC chips and other components may or may not be shown within the FIGS. for simplicity of illustration and discussion, and so as not to obscure the invention. Further, arrangements may be shown in block diagram form in order to avoid obscuring the invention, and also in view of the fact that specifics with respect to implementation of such block diagram arrangements are highly dependent upon the platform within which the present invention is to be implemented, i.e., such specifics should be well within purview of one skilled in the art. Where specific details (e.g., circuits) are set forth in order to describe example embodiments of the invention, it should be apparent to one skilled in the art that the invention can be practiced without, or with variation of, these specific details. The description is thus to be regarded as illustrative instead of limiting.

What is claimed is:

1. A chip, comprising:
    a memory circuit having a majority voter circuit with first and second digitally controlled variable delay elements, the first delay element being controlled by data bits to be written to a portion of the memory circuit, wherein said majority voter circuit is to determine if the data bits are to be inverted prior to being written into the memory circuit portion.

2. The chip of claim 1, in which the memory circuit comprises a register file with a plurality of bit lines each coupled to a plurality of cell access stacks each having an associated bit cell coupled thereto, wherein stacks from separate bit lines define words, the bit cells in each word to be stored with spatially encoded data.

3. The chip of claim 2, in which each word comprises data bits and an encoding bit, wherein data to be stored in the data bits is inverted if more than half of the data bits are higher power consuming states, the encoding bit indicating whether or not the data bits are inverted.

4. The chip of claim 3, in which the register file circuit comprises an XOR gate for each data bit line coupled to the data bit line and to an encoding bit line, the outputs from the XOR gates providing data outputs for the register file circuit.

5. The chip of claim 1, in which the memory circuit comprises a ROM circuit.

6. The chip of claim 1, in which the memory circuit comprises a dynamic random access circuit.

7. A circuit comprising:
  a register file circuit having a plurality of bit lines including data bit lines and an encoding bit line, each bit line having a number of cell access stacks each with a data input to be at a first value or at a second value that causes more power to be consumed than the first value;
  a majority voter circuit with first and second digitally controlled variable delay elements, the first delay element being controlled by data bits to be written to cells associated with a bit line of cell access stacks, wherein said majority voter circuit determines if a majority of said data bits are of the second value and if so, causes the data bits to be inverted prior to being written into the cells; and
  a gate for each data bit line coupled to an associated data bit line and to the encoding bit line to provide at an output a correct data value based on data at its associated data bit line and the encoding bit line.

8. The circuit of claim 7, in which the cell access stacks each comprise an NMOS transistor coupled to the data input, wherein the second value is a logical High value.

9. The circuit of claim 8, in which the register file comprises word groups with a cell access stack from each bit line, wherein data to be written to a word group is inverted before being written if more than half of its data values are logical High values.

10. The circuit of claim 9, in which the gates comprise XOR logic.

11. The circuit of claim 10, comprising the majority voter circuit coupled ahead of a write port to the register file circuit to indicate if more than half of the bit values in a word group are logical High values.

12. The circuit of claim 7, in which the cell access stacks each comprise a PMOS transistor coupled to the data input, wherein the second value is a logical Low value.

13. A method comprising:
  determining if more than half of data bits to be written into a portion of a register file word are higher power consuming bits by using them to control a delay element in a majority voter circuit;
  writing into the portion of the register file word (i) an inverted form of the data bits if the majority voter circuit determines that more than half of the data bits are higher power consuming bits and (ii) a non-inverted form of the data bits if it determines that less than half of the data bits are higher power consuming bits; and
  writing into an encoding portion of the word a value indicating whether the data is the inverted or non-inverted form.

14. The method of claim 13, in which the higher power consuming value is a logical High value.

15. The method of claim 13, further comprising XOR'ing the encoding portion value with the data portion value to obtain the correct data portion of the word when it is read.

16. A system, comprising:
  (a) a microprocessor having a memory circuit with spatially encoded stored data, the memory circuit having a majority voter circuit with first and second digitally controlled variable delay elements, the first delay element being controlled by data bits to be written to a portion of the memory circuit, wherein said majority voter circuit is to determine if the data bits are to be inverted prior to being written into the memory circuit portion;
  (b) an antenna.
  (c) a wireless interface coupled to the microprocessor and to the antenna to communicatively link the microprocessor to a wireless network.

17. The system of claim 16 in which the memory comprises a register file with a plurality of bit lines each coupled to a plurality of cell access stacks each having an associated bit cell coupled thereto, wherein stacks from separate bit lines define words, wherein the bit cells in each word are to be stored with spatially encoded data.

18. The chip of claim 17, in which each word comprises data bits and an encoding bit, wherein data to be stored in the data bits is inverted if more than half of the data bits are higher power consuming values, the encoding bit indicating whether or not the data bits are inverted.

19. The chip of claim 18, in which the register file circuit comprises an XOR gate for each data bit line coupled to the data bit line and to the encoding bit line, the outputs from the XOR gates providing data outputs for the register file circuit.

* * * * *